US011315810B2

(12) United States Patent
Tseng et al.

(10) Patent No.: US 11,315,810 B2
(45) Date of Patent: Apr. 26, 2022

(54) APPARATUS FOR WAFER PROCESSING

(71) Applicant: TAIWAN SEMICONDUCTOR MANUFACTURING COMPANY LTD., Hsinchu (TW)

(72) Inventors: Tung-Ching Tseng, Taipei (TW); Sung-Po Yang, Taoyuan County (TW); Feng-Tao Lee, Miaoli County (TW); Shih Fang Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 93 days.

(21) Appl. No.: 16/415,972

(22) Filed: May 17, 2019

(65) Prior Publication Data
US 2020/0365428 A1 Nov. 19, 2020

(51) Int. Cl.
*H01L 21/67* (2006.01)
*G03F 7/20* (2006.01)
*G02B 5/08* (2006.01)

(52) U.S. Cl.
CPC ...... *H01L 21/67115* (2013.01); *G02B 5/0891* (2013.01); *G03F 7/70033* (2013.01)

(58) Field of Classification Search
USPC .............. 219/258, 390, 405; 427/557–559; 438/689–697; 250/492.1–504 R
See application file for complete search history.

(56) References Cited

U.S. PATENT DOCUMENTS

| 5,368,647 | A | * | 11/1994 | Suzuki | C23C 16/482 118/50.1 |
| 6,080,965 | A | * | 6/2000 | Osawa | H01L 21/67115 118/725 |
| 8,426,778 | B1 | * | 4/2013 | Bolt | B05D 3/067 219/405 |
| 2008/0073655 | A1 | * | 3/2008 | Albrecht | H01L 31/02363 257/79 |

(Continued)

FOREIGN PATENT DOCUMENTS

JP 2009260061 * 11/2009

OTHER PUBLICATIONS

Machine Translation JP2009260061, Nakajima (Year: 2009).*

(Continued)

*Primary Examiner* — Rakesh K Dhingra
(74) *Attorney, Agent, or Firm* — WPAT, P.C., Intellectual Property Attorneys; Anthony King

(57) ABSTRACT

An apparatus for wafer processing includes a wafer pedestal configured to support a wafer, a radiation source configured to provide an electromagnetic radiation to the wafer, and a transparent window disposed between the wafer pedestal and the radiation source. The transparent window has a first zone having a first rough surface, and an Ra value of the first rough surface is between approximately 0.5 μm and approximately 100 μm. The apparatus for wafer processing further includes a primary reflector disposed in the radiation source, and a secondary reflector disposed between the transparent window and the radiation source. The rough surface can be provided over the transparent window, the primary reflector, and/or the secondary reflector.

17 Claims, 14 Drawing Sheets

(56) References Cited

U.S. PATENT DOCUMENTS

| | | | |
|---|---|---|---|
| 2012/0132618 A1* | 5/2012 | Baluja | G02B 5/22 |
| | | | 216/66 |
| 2015/0050753 A1* | 2/2015 | Srinivasan | H01L 21/02538 |
| | | | 438/5 |
| 2016/0358786 A1* | 12/2016 | Hooge | H01L 21/6776 |

OTHER PUBLICATIONS

Yonehara, Makiko, et al. Experimental relationships between surface roughness, glossiness and color of chromatic colored metals. Materials Transactions, 2004, 45.4: 1027-1032.

* cited by examiner

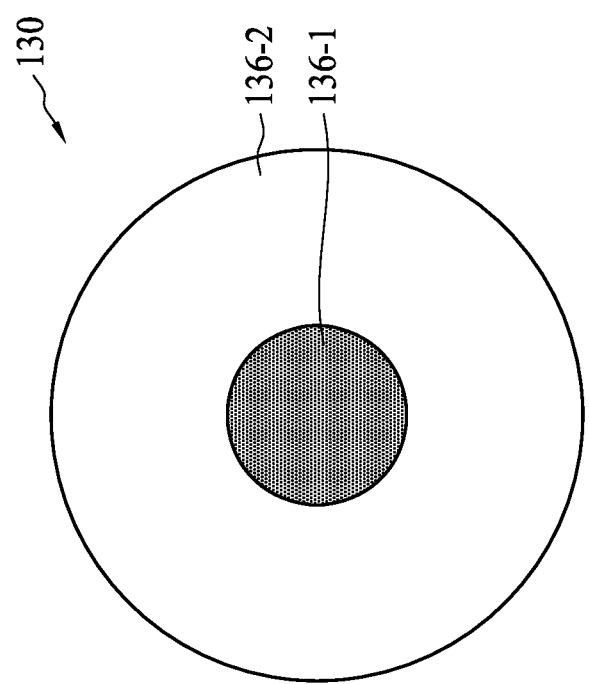

APPARATUS FOR WAFER PROCESSING

BACKGROUND

As the semiconductor industry introduces new generations of integrated circuit (IC) having higher performance and greater functionality, the density of the elements or components that form the IC is increased, while the dimensions, sizes, and spacing between the individual components or elements are reduced. Because such reductions are limited by the ability to define the structures by photolithography, device geometry having smaller dimensions creates new limiting factors. For example, for two adjacent conductive paths, as the distance between the conductors decreases, the resulting capacitance (a function of the dielectric constant (k) of the insulating material divided by the distance between conductive paths) increases. This increased capacitance increases capacitive coupling between the conductors, power consumption and resistive-capacitive (RC) delay.

In the fabrication process for a semiconductor device, numerous processing steps, i.e., as many as several hundred, must be performed on a semiconducting wafer to form the components or devices. During the carrying out of such fabrication process, certain processes can be selected to solve particular problems. For example, a wafer processing method such as UV curing is used to reduce the k-value of dielectric materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a schematic top view illustrating a UV transparent window of the apparatus for wafer processing according to aspects of the present disclosure in one or more embodiments.

DETAILED DESCRIPTION

Figure 1:
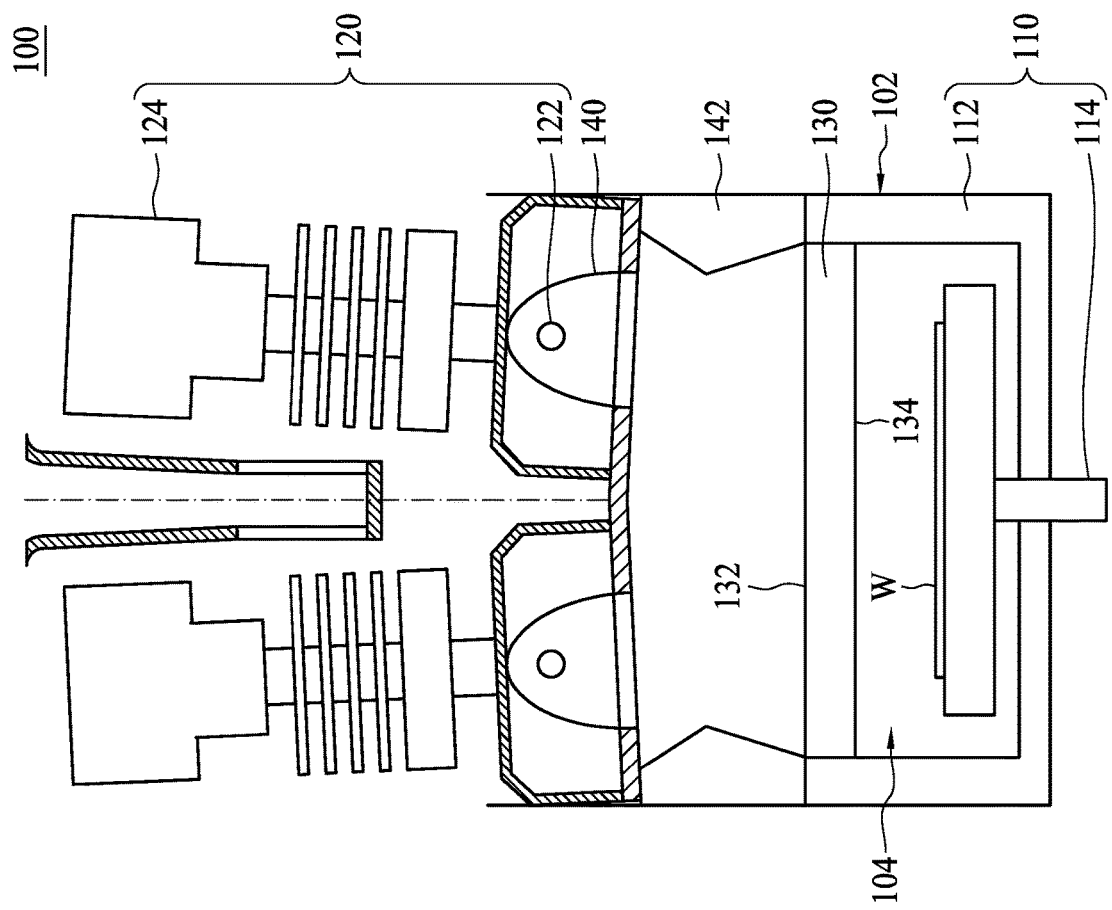
FIG. 1 is a schematic drawing illustrating an apparatus for wafer processing according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

UV curing is employed to reduce the k-value of dielectric materials such as oxides deposited by chemical vapor deposition (CVD) processes. UV curing is used to drive out porogen from composite porogen-dielectric films, leaving a porous dielectric matrix with a low k-value between about 2.0 and about 2.6. UV curing takes place in a chamber filled with a gas. A wafer is placed in the chamber and exposed to UV radiation.

During the UV curing of the dielectric films, it is desirable to maintain uniform UV curing intensity over the entire surface of the wafer to avoid problems such as film shrinkage at portions of the wafer that may be disproportionately exposed to greater levels of radiation which may cause variability in device performance. Existing apparatus for UV curing have utilized arrangements that sometimes result in higher localized UV radiation intensity regions on the wafer, usually at the central region of the wafer, because of the arrangement of the UV lamp. This results in inconsistent UV dosage and poor curing uniformity over the surface of the wafer. The central region of the wafer, which is exposed to greater UV intensity, is further associated with higher "within wafer" shrinkage than the outer regions of the wafer, which adversely affects electric performance for devices built on the wafer within the central high-shrinkage location. As wafer sizes progress from 300 mm to 450 mm, the non-uniformity problems can be expected to worsen.

Therefore, the embodiments of the present disclosure provide an apparatus for wafer processing, such as UV curing, to provide uniform UV radiation to the wafer. In some embodiments, a rough surface is provided over a UV transparent window of the apparatus. In some embodiments, a rough surface is provided over a primary reflector of the apparatus. In some embodiments, a rough surface is provided over a secondary reflector of the apparatus. In some embodiments, the apparatus can include the combination of the above mentioned rough surfaces over the UV transparent window, the primary reflector and the secondary reflector. It should be understood that surface roughness can be defined with an arithmetic mean Ra. The arithmetic mean Ra indicates an arithmetic mean of each peak (according to highest and lowest parts of the surface of the first conductive layer). Simply speaking, the higher Ra can indicates a rough surface including a large number of recessed regions. The rough surface helps to scatter UV radiation and thus uniformity of the UV radiation is improved.

FIG. 1 is a schematic drawing illustrating an apparatus for wafer processing according to aspects of the present disclosure in one or more embodiments. In some embodiments, the apparatus for wafer processing can be an apparatus for UV curing 100, but the disclosure is not limited thereto. Referring to FIG. 1, the apparatus 100 may include an enclosure 102 defining a UV radiation processing chamber 104 therein for housing a wafer W during a UV curing operation. The apparatus 100 further includes a wafer pedestal 110 configured to support the wafer W during the UV curing operation. In some embodiments, the wafer pedestal 110 can include a platter 112, which is configured to accommodate the wafer W. The platter 112 may be made of any suitable material capable of withstanding the temperature, pressure and environment within the chamber 104. The wafer pedestal 110 can be moved up and down.

In some embodiments, the apparatus 100 may include a gas inlet and a gas outlet, though not shown in FIG. 1. The gas inlet and gas outlet are configured to supply a gas such as an inert cooling or purge gas to the chamber 104 and to remove the gas from the chamber 104, respectively. In some embodiments, a cleaning gas for removing accumulated residues from the chamber 104 can be supplied and removed via the gas inlet and the gas outlet, respectively. In some embodiments, the gas outlet can be connected to a vacuum pump for forming a pressure below atmospheric pressure. In some embodiments, the chamber 104 can be held at a vacuum, atmospheric, or positive pressures.

In some embodiments, the apparatus 100 includes a radiation source 120 configured to generate an electromagnetic radiation. In some embodiments, the radiation source 120 is a UV radiation source 120. In some embodiments, only one set of UV radiation source 120 is adopted in the apparatus 100. In some embodiments, two sets of UV radiation sources 120 can be adopted in the apparatus 100, as shown in FIG. 1, but the disclosure is not limited thereto. The UV radiation source 120 is configured to provide UV radiation to the wafer W. The UV radiation source 120 includes a UV lamp 122. In some embodiments, the UV radiation source 120 can include a microwave system 124, but the disclosure is not limited thereto. The UV lamp 122 can be an electroless high power mercury (Hg) microwave lamp, a pulsed xenon (Xe) lamp, or a high-efficiency UV light-emitting diode array. In some embodiments, the UV lamp 122 may include an elongated UV bulb, wherein the UV bulb is a sealed plasma bulb filled with one or more gases such as Xe or Hg for excitation by power sources such as the microwave system 124. The microwave system 124 is capable of generating a microwave energy field for energizing the UV lamp 122 to emit electromagnetic radiation. In some other embodiments, the UV bulb can include an electrode or filament therein such that the power sources represent circuitry and/or current supplies, such as direct current (DC) or pulsed DC, to the electrode. The UV lamp 122 may be selected to produce UV radiation having any appropriate wavelength for the process requirements encountered. As an example, the UV radiation wavelength used may be in the range from approximately 193 nm to approximately 500 nm, but the disclosure is not limited thereto.

Still referring to FIG. 1, the apparatus 100 includes a transparent window 130 disposed between the wafer pedestal 110 and the radiation source 120. The transparent window 130 is provided to separate and isolate the chamber 104 and the UV radiation source 120. However, the transparent window 130 allows UV radiation to pass through to the wafer W. The transparent window 130 can be made of quartz glass, but the disclosure is not limited thereto. The transparent window 130 has sufficient thickness to maintain vacuum without cracking. In some embodiments, a diameter of the transparent window 130 is approximately 400 mm, but the disclosure is not limited thereto.

In some embodiments, the apparatus 100 includes a primary reflector 140 disposed in the UV radiation source 120. In some embodiments, the primary reflector 140 partially surrounds the UV lamp 122, as shown in FIG. 1. In some embodiments, the primary reflector 140 has a tunnel configuration. In some embodiments, the UV lamp 122 is positioned near a top of the tunnel, and an opening of the primary reflector 140 faces the transparent window 130. In some embodiments, the primary reflector 140 has an approximately parabolic or U-shaped reflective inner surface. Accordingly, the primary reflector 140 is configured to reflect the UV radiation toward the transparent window 130. In other words, the primary reflector 140 can guide the UV radiation provided from the UV lamp 122 to the wafer W.

In some embodiments, the apparatus 100 includes a secondary reflector 142 disposed between the transparent window 130 and the UV radiation source 120. The secondary reflector 142 can reflect the UV radiation and thus increase the intensity of the energy provided to the wafer W. In some embodiments, the secondary reflector 142 and the radiation source 120 rotates during the process.

Figure 3A:
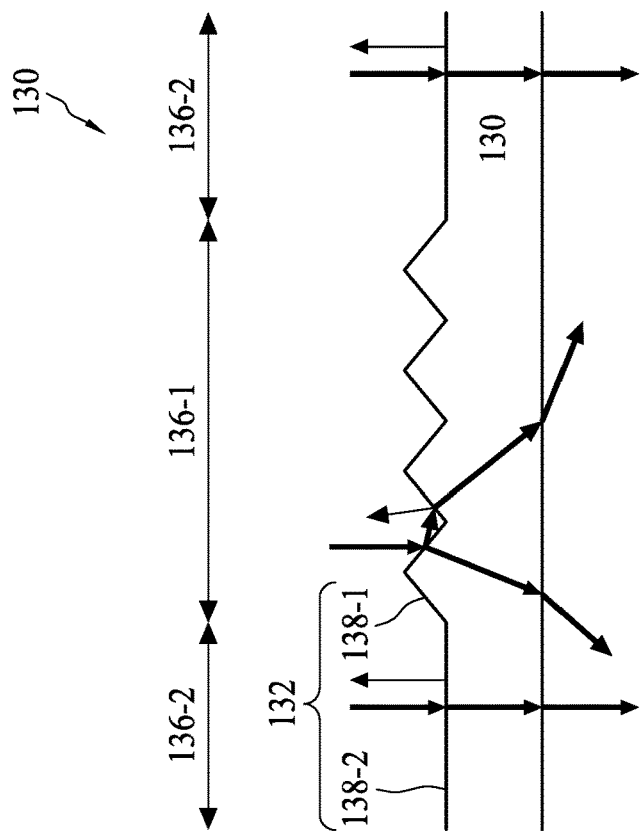
FIG. 3A is a cross-sectional view of the transparent window of the apparatus for wafer processing according to aspects of the present disclosure in one or more embodiments.
Figure 3B:
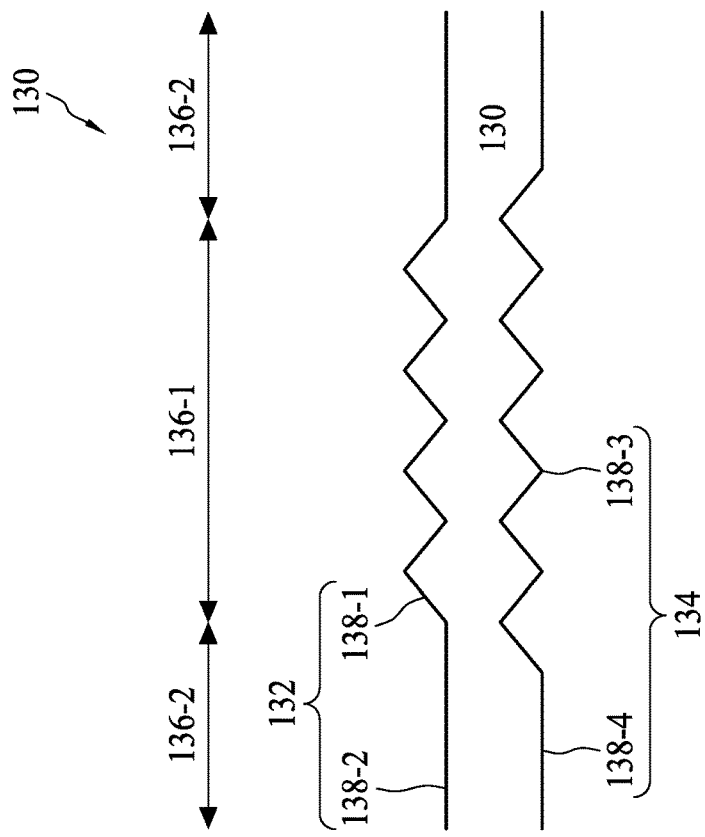
FIG. 3B is a cross-sectional view of the transparent window of the apparatus for wafer processing according to aspects of the present disclosure in one or more embodiments.

Please refer to FIGS. 1, 2, 3A and 3B, wherein FIG. 2 is a schematic top view illustrating a UV transparent window of the apparatus for wafer processing according to aspects of the present disclosure in one or more embodiments, and FIGS. 3A and 3B are cross-sectional views of the transparent window of the apparatus for wafer processing according to aspects of the present disclosure in different embodiments. In some embodiments, the transparent window 130 has a first surface 132 facing the radiation source 120 and a second surface 134 opposite to the first surface 132. The second surface 134 faces the wafer pedestal 110. In some embodiments, a first zone 136-1 and a second zone 136-2 are defined over the first surface 132, as shown in FIG. 3A. In other embodiments, the first zone 136-1 and the second zone 136-2 are defined over both of the first surface 132 and the second surface 134, as shown in FIG. 3B. In some embodiments, the first zone 136-1 has a circular shape and is defined in a center region of the transparent window 130. In some embodiments, a diameter of the first zone 136-1 is less than a diameter of the UV transparent window 130. In some embodiments, the diameter of the first zone 136-1 is between approximately 0.5 cm and approximately 5 cm, but the disclosure is not limited thereto. In some embodiments, the second zone 136-2 is arranged concentric to the first zone 136-1 and encircles the first zone 136-1, as shown in FIG. 2.

Referring to FIG. 3A, in some embodiments, the first zone 136-1 has a rough surface 138-1, and an arithmetical mean roughness (Ra) value of the rough surface 138-1 is between approximately 0.5 micrometer and approximately 100 µm, but the disclosure is not limited thereto. In some comparative embodiments, if the Ra value of the rough surface 138-1 is greater than 100 µm, light absorption is increased and thus light utilization efficiency of the UV transparent window 130 may be unwantedly reduced. In some embodiments, an Ra value of a surface 138-2 of the second zone 136-2 is less than the Ra value of the rough surface 138-1. In some embodiments, the Ra value of the surface 138-2 of the second zone 136-2 is less than 0.5 µm, but the disclosure is not limited thereto. In some embodiments, the Ra value of the surface 138-2 of the second zone 136-2 is less than 0.3 µm, but the disclosure is not limited thereto. Therefore, the surface 138-2 of the second zone 136-2 is a smooth surface when compared to the rough surface 138-1 of the first zone 136-1. In other words, the first surface 132 is divided into the rough surface 138-1 and the smooth surface 138-2, as shown in FIGS. 2 and 3A.

Referring to FIG. 3B, in some embodiments, the first zone 136-1 has a rough surface 138-1 over the first surface 132 and a rough surface 138-3 over the second surface 134. An Ra value of the rough surfaces 138-1 and 138-3 is between approximately 0.5 µm and approximately 100 µm, but the disclosure is not limited thereto. In some embodiments, an Ra value of a surface 138-2 over the first surface 132 and an Ra value of a surface 138-4 over the second surface 134 in the second zone 136-2 are less than the Ra value of the rough surfaces 138-1 and 138-3. In some embodiments, the Ra value of the surfaces 138-2 and 138-4 of the second zone 136-2 is less than 0.5 µm, but the disclosure is not limited thereto. In some embodiments, the Ra value of the surfaces 138-2 and 138-4 of the second zone 136-2 is less than 0.3 µm, but the disclosure is not limited thereto. Therefore, the surfaces 138-2 and 138-4 of the second zone 136-2 are a smooth or a mirror-polished surface when compared to the rough surfaces 138-1 and 138-3 of the first zone 136-1. In other words, both of the first surface 132 and the second surface 134 are divided into the rough surfaces 138-1, 138-3 and the smooth surfaces 138-2, 138-4, as shown in FIGS. 2 and 3B.

Referring to FIGS. 3A and 3B, the rough surfaces 138-1 and 138-3 can be formed by bead blast, sanding, grinding or chemical etching, but the disclosure is not limited thereto. In some embodiments, the rough surfaces 138-1 and 138-3 respectively include a plurality of protrusions and a plurality of recesses alternately arranged, but the disclosure is not limited thereto.

Referring to FIG. 3A, because the first surface 132 faces the UV radiation source 120, UV radiation enters the transparent window 130 from the first surface 132. Significantly, the rough surface 138-1 helps to reduce light reflection. For example, a reflectivity of the smooth surface 138-2 of the first surface 132 is approximately 3%, and a reflectivity of the rough surface 138-1 of the first surface 132 is reduced to less than approximately 0.1%. In other words, light utilization efficiency of the UV transparent window 130 is improved.

Referring to FIGS. 3A and 3B, due to the rough surfaces 138-1 and/or 138-3, incident angles of the UV radiation entering and leaving the transparent window 130 are changed. In other words, the UV radiation within the first zone 136-1 is scattered by the rough surfaces 138-1 and/or 138-3. It should be noted that because the first zone 136-1 is defined in the center region of the transparent window 130, the UV radiation in the center region of the transparent window 130 is scattered. Therefore, in some embodiments, the first zone 136-1 can be referred to as a diffusive zone, while the second zone 136-2 can be referred as a mirror-polished zone, but the disclosure is not limited thereto. Accordingly, the UV radiation incident to a region of the wafer W corresponding to the first diffusive zone 136-1 is reduced, and UV intensity on that region, usually a central region of the wafer W, is reduced.

In some comparative embodiments using a transparent window having both surfaces with an Ra value less than 0.5 µm, the central region of the wafer is exposed to greater UV intensity and associated with higher "within wafer" shrinkage than the outer regions of the wafer, which adversely affects electric performance for devices built on the wafer within this central high shrinkage location. However, such localized impact can be mitigated by the rough surfaces 138-1 and/or 138-3 of the transparent window 130. Additionally, because the UV radiation is redirected and scattered from the center region of the transparent window 130, UV intensity to the entire transparent window 130 is also made more uniform and thus thermal stress over the center region of transparent window 130 may be reduced. It should be noted that, as mentioned above, the diameter of the first region 136-1 (including the rough surface 138-1) is between approximately 0.5 cm and approximately 5 cm. In some comparative embodiments, when the diameter of the first region 136-1 is less than 0.5 cm, light scattering result is reduced, and thus UV intensity to the entire transparent window 130 is less uniform. In some comparative embodiments, when the diameter of the first region 136-1 is greater than 5 cm, light scattering result in an amount of light too much such that light utilization efficiency may be reduced.

Figure 4:
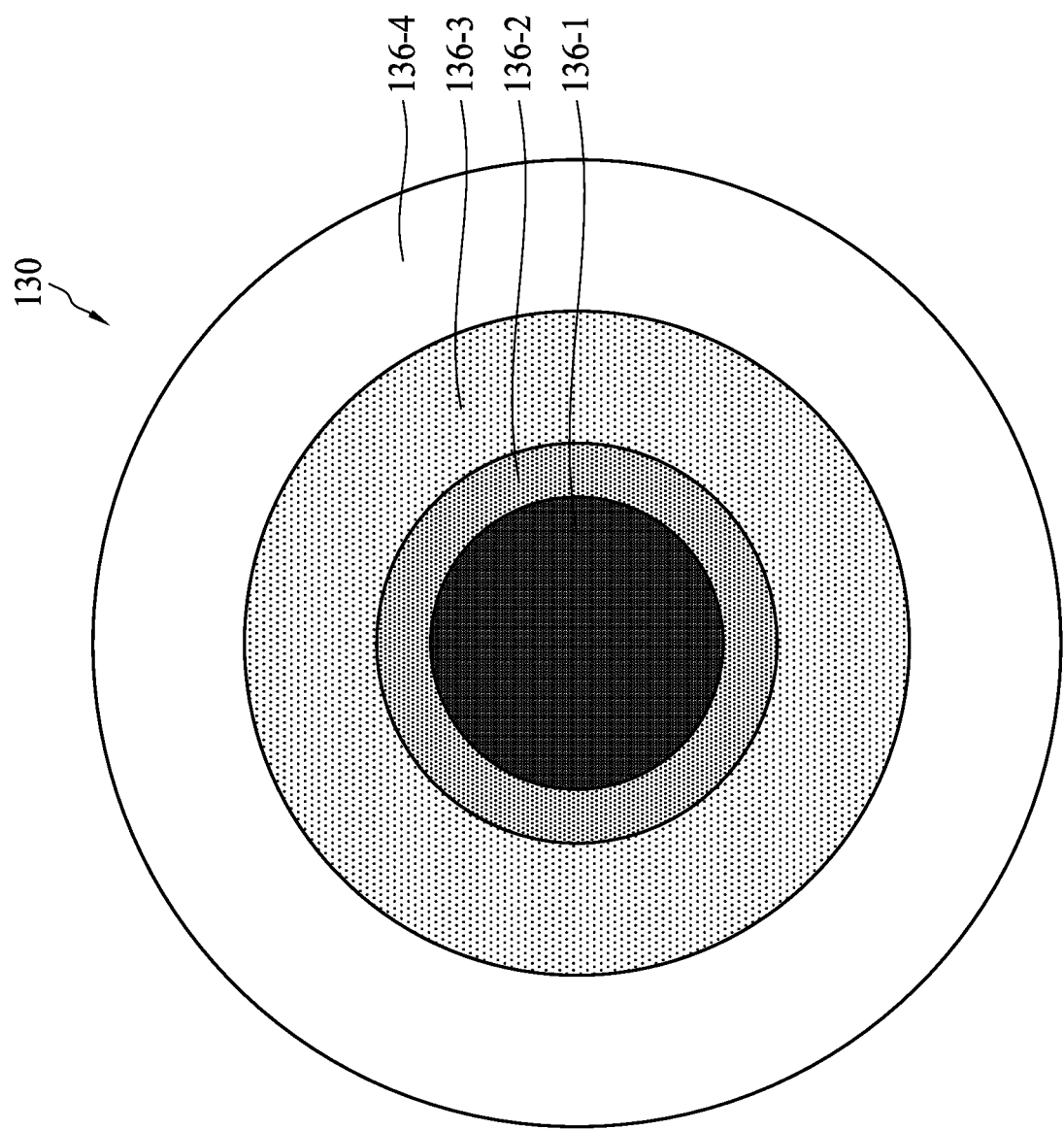
FIG. 4 is a schematic top view illustrating a transparent window of the apparatus for wafer processing according to aspects of the present disclosure in one or more embodiments.

Please refer to FIG. 4, which is a schematic top view illustrating a transparent window of the apparatus for wafer processing according to aspects of the present disclosure in one or more embodiments. In some embodiments, the transparent window 130 can have a first surface 132 facing the UV radiation source 120 and a second surface 134 opposite to the first surface 132. It should be noted that a cross-sectional view of the transparent window 130 can be similar to those shown in FIG. 3A or 3B, and therefore such details are omitted in the interest of brevity. In some embodiments, a first zone 136-1, a second zone 136-2, a third zone 136-3 and an nth zone 136-n can be defined over the first surface 132 and/or the second surface 134. In some embodiments, n can be 4, as shown in FIG. 4, but the disclosure is not limited thereto. It should be easily realized that a plurality of zones 136-1 to 136-n can be defined according to process requirements. In some embodiments, the first zone 136-1 has a circular shape and is defined in a center region of the transparent window 130. In some embodiments, a diameter of the first zone 136-1 is less than a diameter of the UV transparent window 130. The diameter of the first zone 136-1 can be similar to that mentioned above, and therefore such detail is omitted for brevity. In some embodiments, the second zone 136-2 is arranged concentric to and encircles the first zone 136-1, the third zone 136-3 is arranged concentric to and encircles the second zone 136-2, and the fourth zone 136-4 is arranged concentric to and encircles the third zone 136-3, as shown in FIG. 4.

In some embodiments, each of the first zone 136-1, the second zone 136-2 and the third zone 136-3 has a rough surface, and an Ra value of each of the rough surfaces is between approximately 0.5 µm and approximately 100 µm, but the disclosure is not limited thereto. Significantly, the Ra value of the rough surface of the second zone 136-2 is less than the Ra value of the rough surface of the first diffusive zone 136-1, and the Ra value of the rough surface of the third zone 136-3 is less than the Ra value of the rough surface of the second 136-2. Further, an Ra value of a surface of the fourth zone 136-4 is less than the Ra value of the rough surface of the third zone 136-3. In some embodiments, the Ra value of the surface of the fourth zone 136-4 is less than 0.5 µm, but the disclosure is not limited thereto. In some embodiments, the Ra value of the surface of the fourth zone 136-4 is less than 0.3 µm, but the disclosure is not limited thereto. Therefore, the surface of the fourth zone 136-4 is a smooth surface when compared to the rough surfaces of the first, second and third zones 136-1, 136-2 and 136-3. In other words, the first surface 132 of the transparent window 130 can be divided into a plurality of zones having the rough surfaces with outwardly-reducing Ra values, as shown in FIG. 4. Therefore, in some embodiments, the first zone 136-1, the second zone 136-2 and the third zone 136-3 can be referred to as diffusive zones, while the fourth zone 136-4 can be referred as a mirror-polished zone, but the disclosure is not limited thereto.

Accordingly, the Ra value of the first surface 132 is increased centripetally, and thus light scattering is increased centripetally. In other words, the UV radiation incident to a region of the wafer W is reduced centripetally, and localized impact issues, such as a central high-shrinkage location, are mitigated.

Figure 5:
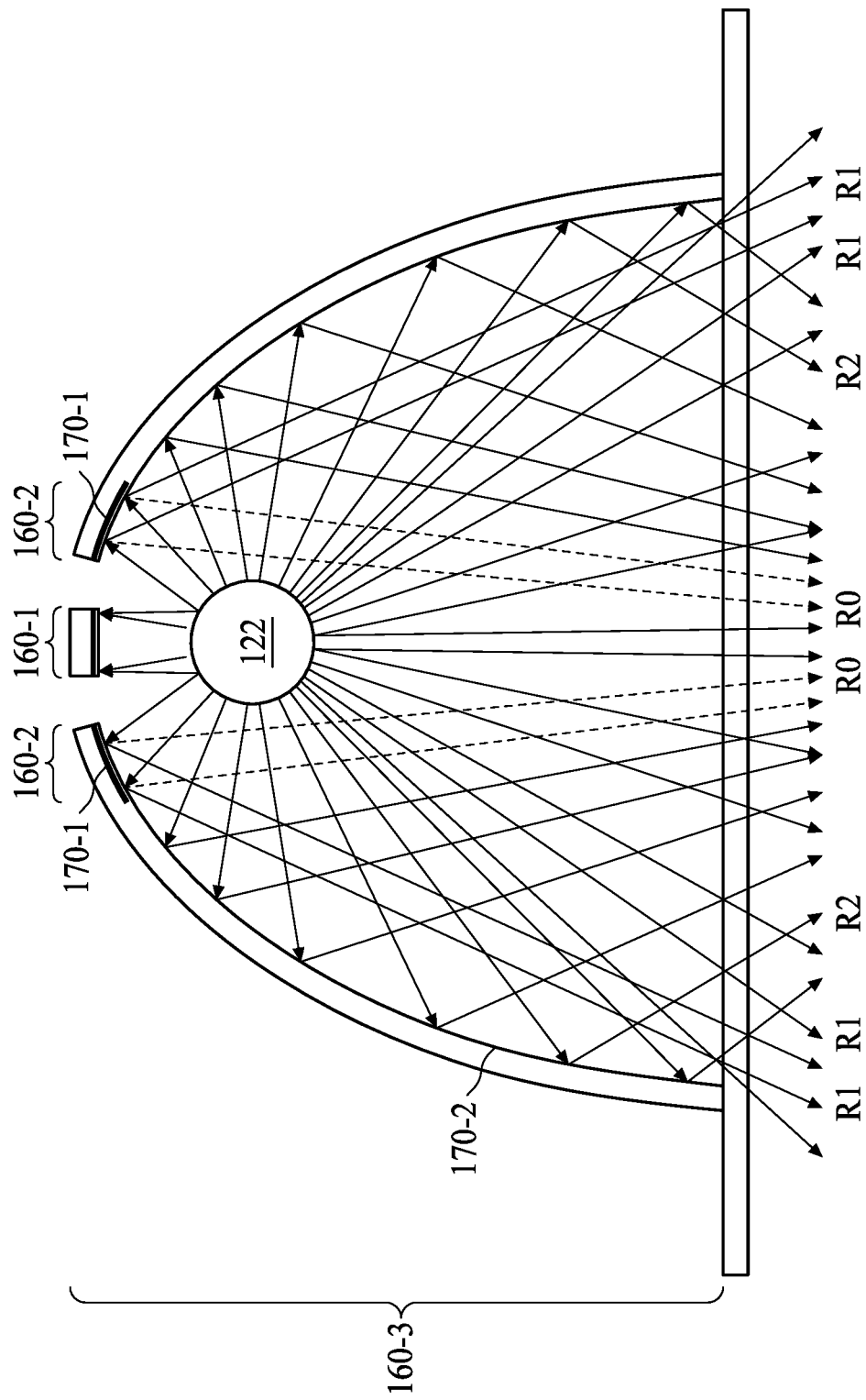
FIG. 5 is a side view of a primary reflector of the apparatus for wafer processing according to aspects of the present disclosure in one or more embodiments.
Figure 6:
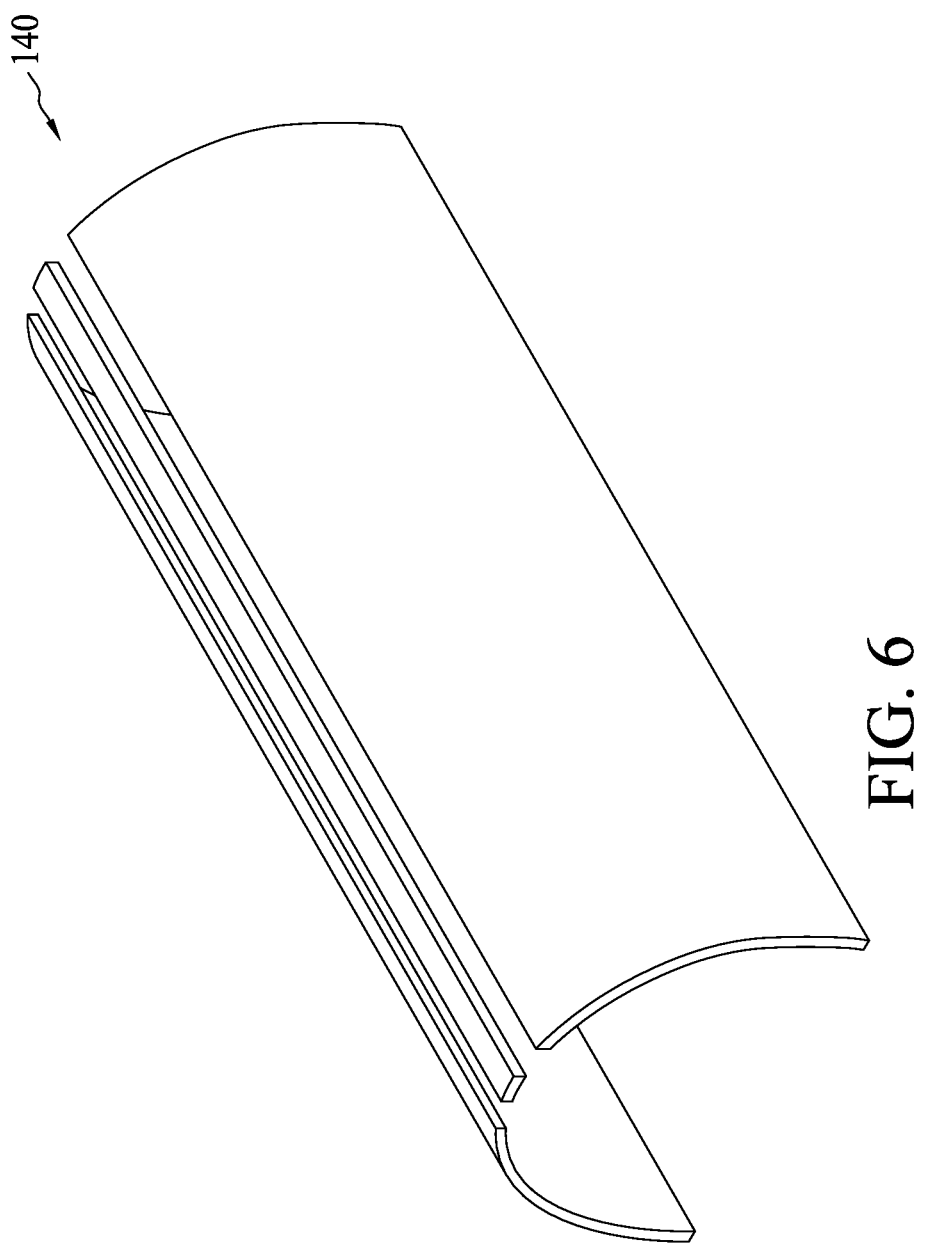
FIG. 6 is a perspective view of a primary reflector of the apparatus for wafer processing according to aspects of the present disclosure in one or more embodiments.
Figure 7:
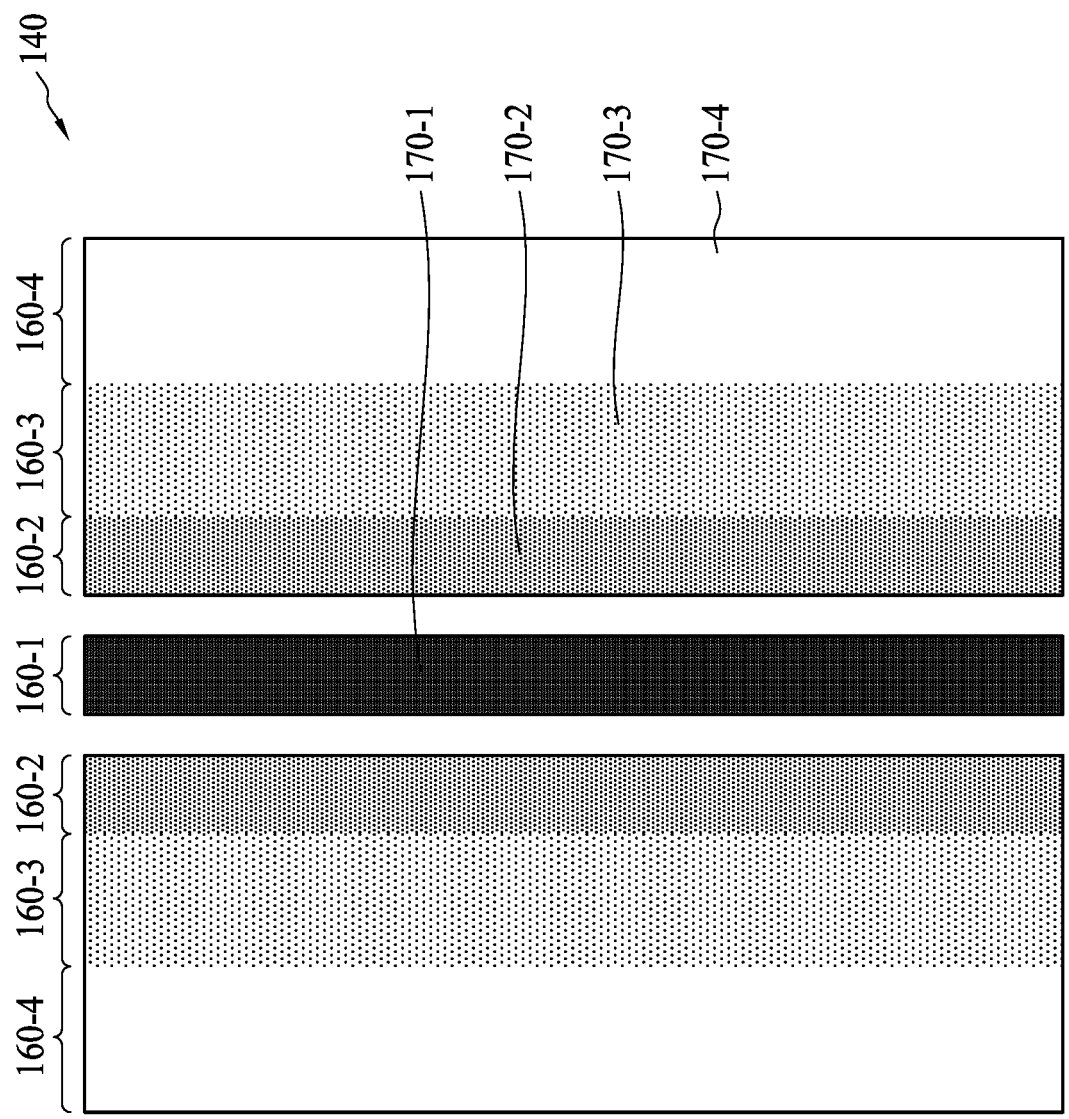
FIG. 7 is a bottom view of a primary reflector of the apparatus for wafer processing according to aspects of the present disclosure in one or more embodiments.
Figure 8:
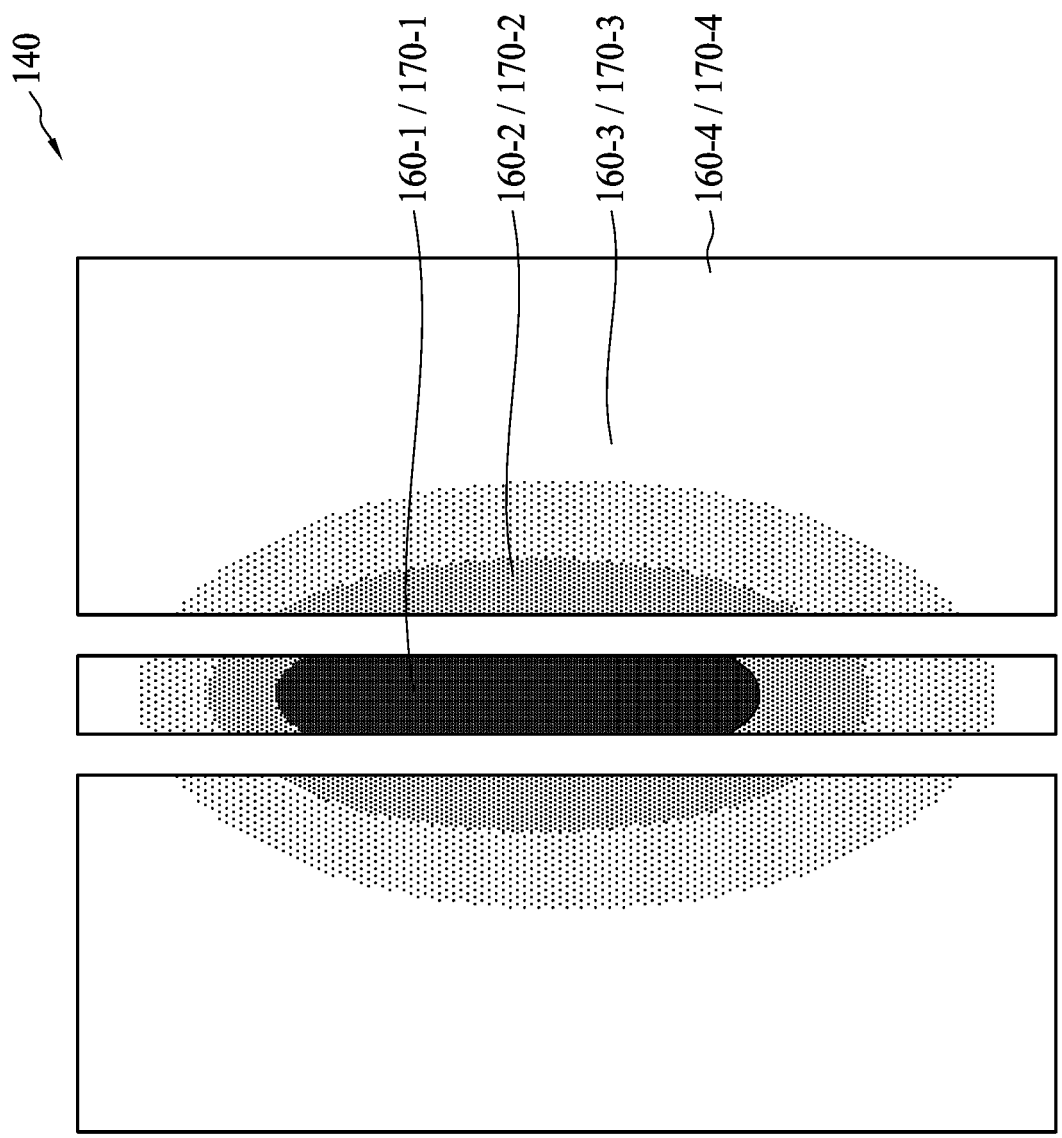
FIG. 8 is a bottom view of a primary reflector of the apparatus for wafer processing according to aspects of the present disclosure in one or more embodiments.

Please refer to FIGS. 1 and 5 to 8, wherein FIG. 5 is a schematic side view and FIG. 6 is a perspective view illustrating a primary reflector of the apparatus for wafer processing according to aspects of the present disclosure in one or more embodiments. FIGS. 7 and 8 are bottom views of the primary reflector of the apparatus for wafer processing according to aspects of the present disclosure in different embodiments. The primary reflector 140, which is disposed over and partially surrounds the UV lamp 122, has a tunnel shape. In some embodiments, a plurality of reflective zones can be formed over the inner surface of the primary reflector 140. In some embodiments, a first reflective zone 160-1, and an nth reflective zone 160-n can be defined over the inner surface of the primary reflector 140. In some embodiments, n can be a positive integer equal to or greater than 2, as shown in FIG. 5, but the disclosure is not limited thereto. As shown in FIG. 5, a first reflective zone 160-1 and a second reflective zone 160-2 are defined over an inner surface of the primary reflector 140, as shown in FIG. 5. In some embodiments, each of the first reflective zones 160-1 and the second reflective zone 160-2 has a strap shape. As shown in FIG. 5, the first reflective zone 160-1 maybe defined near a top region of the primary reflector 140, the second reflective zone 160-2 may be defined as a pair of straps and disposed symmetrically to the first reflective zone 160-1.

Referring to FIG. 5, in some embodiments, the first reflective zone 160-1 has a rough surface 170-1, wherein an Ra value of the rough surface 170-1 is between approximately 0.5 µm and approximately 100 µm, but the disclosure is not limited thereto. Additionally, the Ra value of the rough surface 170-1 should be less than 100 µm; otherwise, the light reflection may be overly reduced and light utilization efficiency of the primary reflector 140 may be adversely influenced. In some embodiments, an Ra value of a surface 170-2 of the second reflective zone 160-2 is less than the Ra value of the rough surface 170-1. In some embodiments, the Ra value of the surface 170-2 of the second reflective zone 160-2 is less than 0.5 µm, but the disclosure is not limited thereto. Therefore, the surface 170-2 of the second reflective zone 160-2 is a smooth surface when compared to the rough surface 170-1 of the first reflective zone 160-1. Additionally, the inner surface of the primary reflector 140 is divided into the rough surface 170-1 and the smooth surface 170-2, as shown in FIG. 5.

The rough surfaces 170-1 of the first reflective zone 160-1 can be formed by bead blast, sanding, grinding or chemical etching, but the disclosure is not limited thereto. In some embodiments, the rough surfaces 170-1 may include a plurality of protrusions and a plurality of recesses alternately arranged, but the disclosure is not limited thereto.

Still referring to FIG. 5, in the second reflective zone 160-2, the UV radiation follows the law of reflection, wherein the incident light, the reflected light and the normal to the reflection surface at the point of the incidence lie in the same plane. Further, the angle which the incident light makes with the normal is equal to the angle which the reflected light makes to the same normal, as shown by arrows R2. Significantly, in the first reflective zone 160-1, the UV radiation does not follow the law of reflection because of the rough surface 170-1. As shown in FIG. 5, an incidence angle of the UV radiation is not equal to the apparent reflection angle in the first reflection zone 160-1, as shown by arrows R1. In other words, UV radiation in the first reflective zone 160-1 is scattered by the rough surface 170-1. It should be noted that because the first reflective zone 160-1 is defined near the top region of the primary reflector 140, the UV radiation near the top region of the primary reflector 140 is scattered. Further, the top region of the primary reflector 140 may correspond to a particular localized region of the wafer W, causing the UV radiation incident to that particular localized region of the wafer W to be reduced, and thus the UV intensity provided to that particular localized region is reduced.

In some comparative embodiments using a primary reflector having an entirely smooth reflective inner surface, the UV radiation always follows the law of reflection. That is, reflection near the top region also follows the law of reflection, as shown by arrows R0. Therefore the UV intensity is further associated with greater "within wafer" shrinkage in a particular localized region, which corresponds to the UV reflection R0, of the wafer. Thus, electric performance of devices formed on the wafer is adversely impacted by this localized high shrinkage. However, such localized impact issue can be mitigated by the rough surface 170-1 of the primary reflector 140.

Referring to FIGS. 7 and 8, in some embodiments, a first reflective zone 160-1 and an nth reflective zone 160-n can be defined over the inner surface of the primary reflector 140. In some embodiments, n can be 4, as shown in FIG. 7, but the disclosure is not limited thereto. As shown in FIG. 7, a first reflective zone 160-1, a second reflective zone 160-2, a third reflective zone 160-3 and a fourth reflective zone 160-4 are defined over an inner surface of the primary reflector 140. In some embodiments, each of the reflective zones 160-1, the second reflective zone 160-2, the third reflective zone 160-3 and the fourth reflective zone 160-4 has a strap shape. As shown in FIG. 7, the first reflective zone 160-1 maybe defined near a top region of the primary reflector 140, the second reflective zone 160-2 may be defined as a pair of straps and disposed symmetrically to the first reflective zone 160-1, the third reflective zone 160-3 may be defined as a pair of straps and disposed symmetrically to the first and the second reflective zones 160-1 and 160-2, and the fourth reflective zone 160-4 may be defined as a pair of straps and disposed symmetrically to the first to the third reflective zones 160-1 to 160-3.

Please refer to FIG. 8. In some embodiments, n can be 4, as shown in FIG. 8, but the disclosure is not limited thereto. As shown in FIG. 8, a first reflective zone 160-1, a second reflective zone 160-2, a third reflective zone 160-3 and a fourth reflective zone 160-4 are defined over an inner surface of the primary reflector 140. In some embodiments, the first reflective zone 160-1 maybe defined near a top region of the primary reflector 140. Further, the second reflective zone 160-2 may be arranged to encircle the first reflective zone 160-1, the third reflective zone 160-3 may be arranged to encircle the second reflective zone 160-2, and the fourth reflective zone 160-4 may be arranged to encircle the third reflective zone 160-3.

Referring to FIGS. 7 and 8, in some embodiments, the first reflective zone 160-1 has a rough surface 170-1, wherein an Ra value of the rough surface 170-1 is between approximately 0.5 μm and approximately 100 μm, but the disclosure is not limited thereto. Additionally, the Ra value of the rough surface 170-1 should be less than 100 μm; otherwise, the light reflection may be overly reduced and light utilization efficiency of the primary reflector 140 may be adversely influenced. In some embodiments, an Ra value of a surface 170-2 of the second reflective zone 160-2 is less than the Ra value of the rough surface 170-1, and Ra value of a surface 170-3 of the third reflective zone 160-3 is less than the Ra value of the surface 170-2 of the second reflective zone 160-2, and a Ra value of a surface 170-4 of the fourth reflective zone 160-4 is less than the Ra value of a surface 170-3 of the third reflective zone 160-3. In some embodiments, the Ra value of the surface 170-4 of the fourth reflective zone 160-4 is less than 0.5 μm, but the disclosure is not limited thereto. Therefore, the surface 170-4 of the fourth reflective zone 160-4 is a smooth surface when compared to the rough surfaces of the first, second and third reflective zone 160-1, 160-2 and 160-3. In other words, the inner surface of the primary reflector 140 can be divided into a plurality of reflective zones having the rough surfaces with outwardly-reducing Ra values, as shown in FIGS. 5, 7 and 8.

Accordingly, the Ra value of the inner surface of the primary reflector 140 is increased centripetally, and thus light scattering is increased centripetally. In other words, the UV radiation incident to a region of the wafer W is reduced centripetally, and localized impact issues, such as a central high-shrinkage location, are mitigated.

In some embodiments, the apparatus for wafer processing 100 can include the primary reflector 140 as shown in FIG. 5, 7 or 8, and can further include the transparent window 130 as shown in FIG. 3A, 3B or 4.

Figure 9:
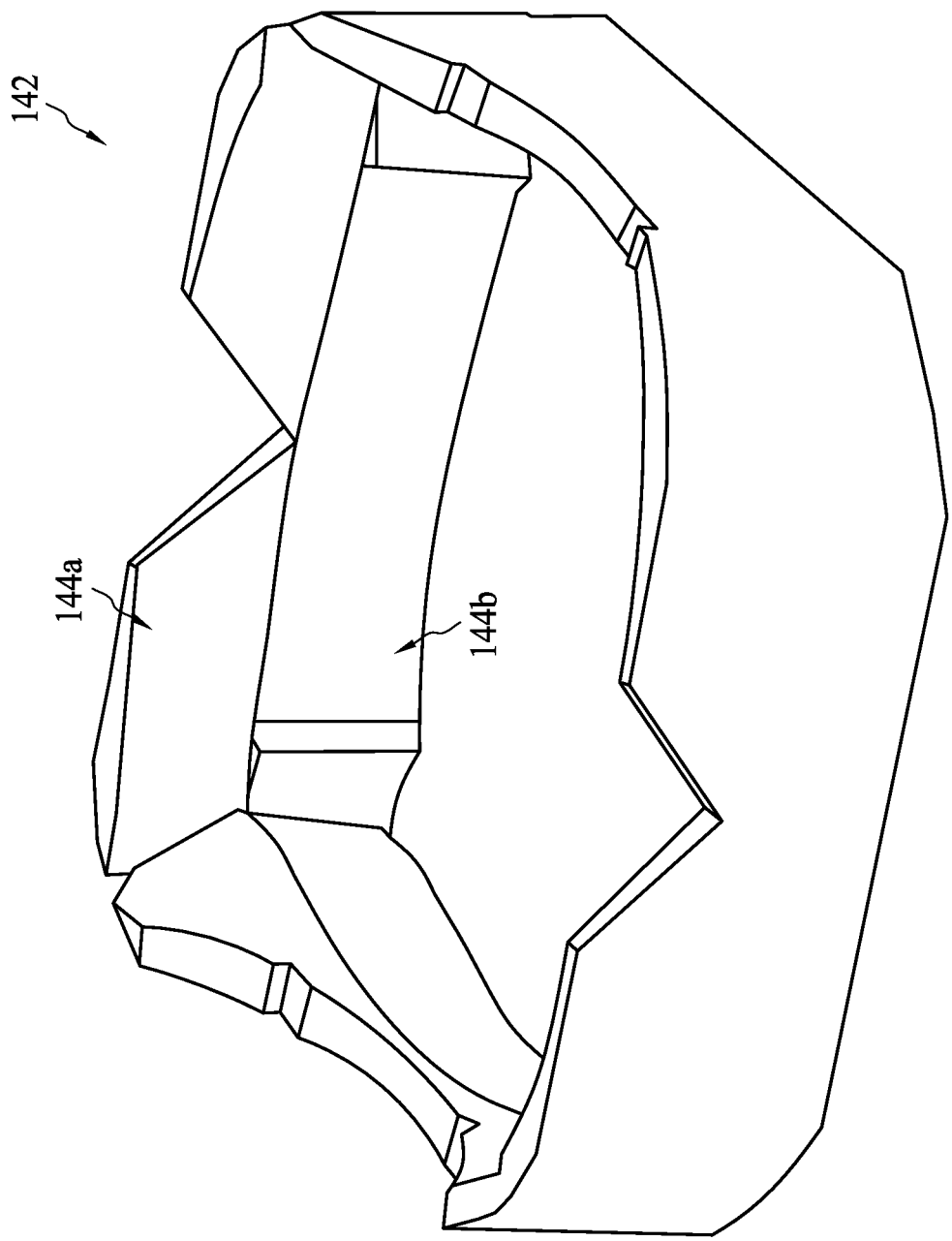
FIG. 9 is a perspective view of a secondary reflector of the apparatus for wafer processing according to aspects of the present disclosure in one or more embodiments.

Please refer to FIGS. 1 and 9 to 14, wherein FIG. 9 is a schematic drawing of a secondary reflector, and FIGS. 10 to 14 are schematic drawings illustrating a secondary reflector of the apparatus for wafer processing according to aspects of the present disclosure in different embodiments. The secondary reflector 142, which is disposed between the UV transparent window 130 and the UV radiation source 120, has a frame configuration. In some embodiments, the secondary reflector 142 has a first reflective slope 144a near the UV radiation source 120 and a second reflective slope 144b near the transparent window 130, as shown in FIGS. 9 to 14. The first reflective slope 144a and the second reflective slope 144b are coupled to each other. In some embodiments, the first reflective slope 144a and the second reflective slope 144b are coupled to form a vertex pointing toward a central axis A of the space within the secondary reflector 142, as shown in FIGS. 10 to 14.

Figure 10:
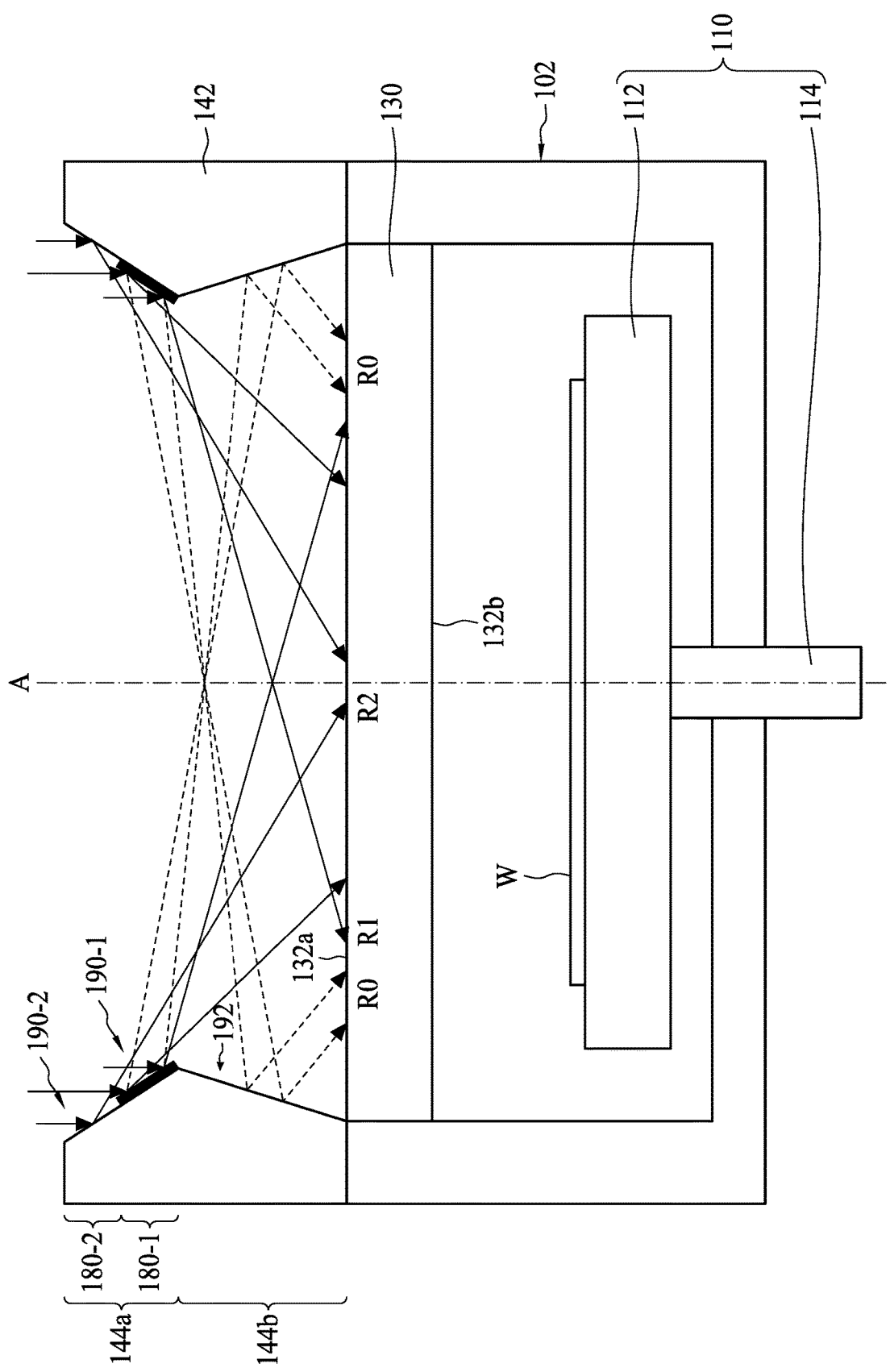
FIG. 10 is a cross-sectional view of a secondary reflector of the apparatus for wafer processing according to aspects of the present disclosure in one or more embodiments.

In some embodiments, a first reflective zone 180-1 and a second reflective zone 180-2 are defined over the first reflective slope 144a, as shown in FIG. 10. In some embodiments, the first reflective zone 180-1 has a frame configuration and is defined to be near the second reflective slope 144b, while the second reflective zone 180-2 is defined to be near the UV radiation source 120. In some embodiments, the second reflective zone 180-2 is arranged concentric to and encircles the first reflective zone 180-1, as shown in FIG. 10. However, in other embodiments, the first reflective zone 180-1 is defined to be near the UV radiation source 120, while the second reflective zone 180-2 is arranged concentric to and encircled by the first reflective zone 180-1 and is near the second reflective slope 144b, as shown in FIG. 11.

Figure 11:
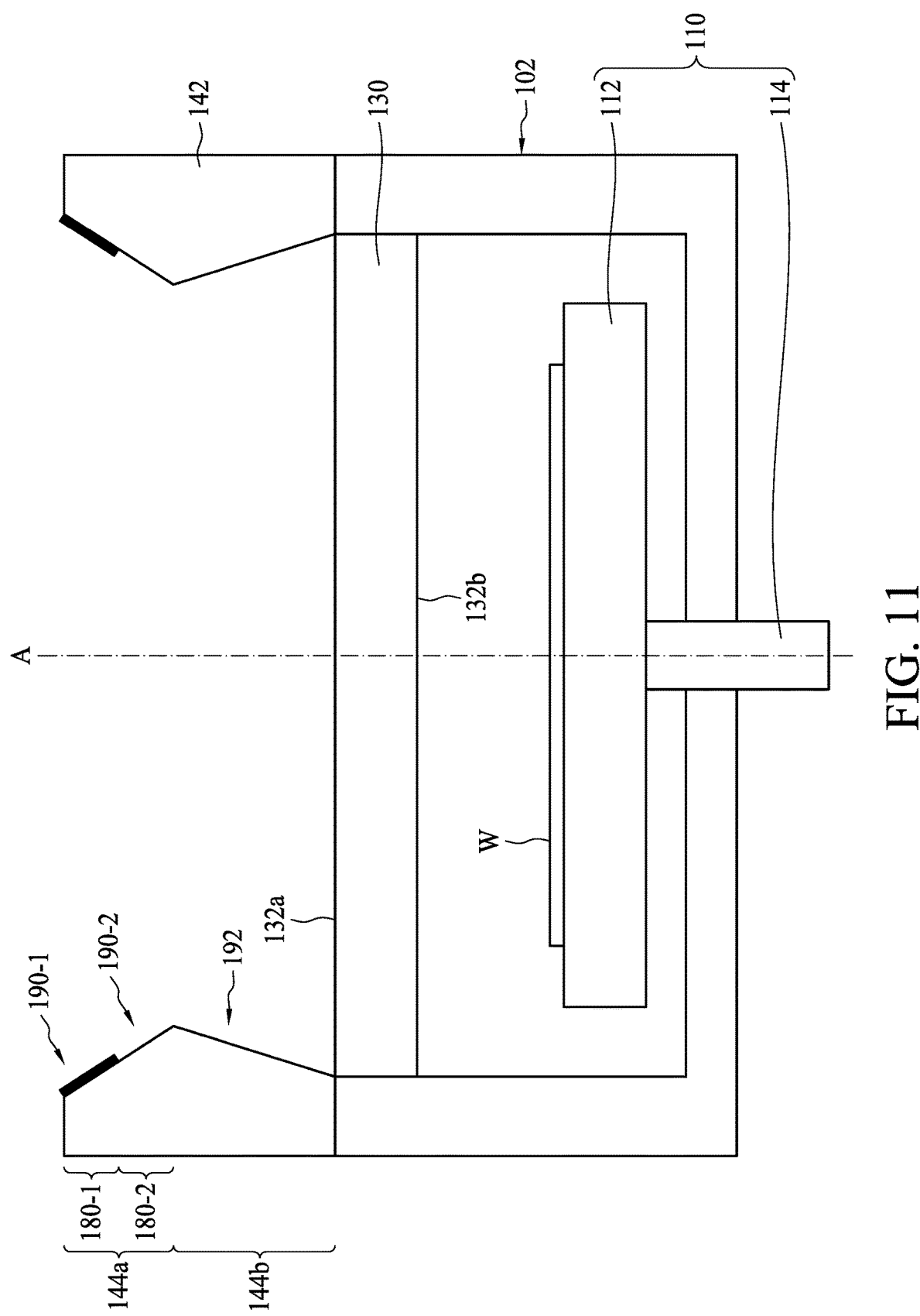
FIG. 11 is a cross-sectional view of a secondary reflector of the apparatus for wafer processing according to aspects of the present disclosure in one or more embodiments.

Referring to FIGS. 10 and 11, in some embodiments, the first reflective zone 180-1 has a rough surface 190-1, and an Ra value of the rough surface 190-1 is between approximately 0.5 µm and approximately 100 µm, but the disclosure is not limited thereto. Additionally, the Ra value of the rough surface 190-1 of the first reflective zone 180-1 should be less than 100 µm; otherwise, the light reflection may be overly reduced and light utilization efficiency of the secondary reflector 142 may be adversely influenced. In some embodiments, an Ra value of a surface 190-2 of the second reflective zone 180-2 is less than the Ra value of the rough surface 190-1 of the first reflective zone 180-1. In some embodiments, the Ra value of the surface 190-2 of the second reflective zone 180-2 is less than 0.5 µm, but the disclosure is not limited thereto. Additionally, an Ra value of a surface 192 of the second reflective slope 144b can be similar to the Ra value of the surface 190-2 of the second reflective zone 180-2, but the disclosure is not limited thereto. Therefore, the surface 190-2 of the second reflective zone 180-2 and the surface 192 of the second reflective slope 144b are smooth surfaces when compared to the rough surface 190-1 of the first reflective zone 180-1. In other words, the first reflective slope 144a of the secondary reflector 142 can be divided into the first reflective zone 180-1 having the rough surface 190-1 and the second reflective zone 180-2 having the smooth surface 190-2, as shown in FIGS. 10 and 11.

The rough surface 190-1 of the first reflective zone 180-1 can be formed by bead blast, sanding, grinding or chemical etching, but the disclosure is not limited thereto. In some embodiments, the rough surface 190-1 of the first reflective zone 180-1 may include a plurality of protrusions and a plurality of recesses alternately arranged, but the disclosure is not limited thereto.

Still referring to FIG. 10, in the second reflective zone 180-2, the UV radiation follows the law of reflection, wherein the incident light, the reflected light and the normal to the reflection surface at the point of the incidence lie in the same plane. Further, the angle that the incident light forms with the normal is equal to the angle that the reflected light forms with the same normal, as shown by arrows R2. Significantly, in the first reflective zone 180-1, the UV radiation does not follow the law of reflection because of its rough surface. As shown in FIG. 10, an incidence angle of the UV radiation is not equal to the reflection angle in the first reflection zone 180-1, as shown by arrows R1. In other words, the UV radiation in the first reflective zone 180-1 is scattered by the rough surface 190-1.

In some comparative embodiments using a secondary reflector having an entirely smooth reflective inner surface, the UV radiation always follows the law of reflection, as shown by arrows R0 and R2. Therefore the UV intensity is further associated with greater "within wafer" shrinkage in a particular localized region, which corresponds to the UV reflection R0, of the wafer W. Thus, electric performance for devices built on the wafer is adversely impacted by such localized high shrinkage. However, such localized impact can be mitigated by the rough surface 190-1 of the first reflective zone 180-1 of the secondary reflector 142.

In some embodiments, a first reflective zone 180-1, a second reflective zone 180-2, and an nth reflective zone 180-n can be defined over the first reflective slope 144a of the secondary reflector 142. N is a positive integer greater than 2, but the disclosure is not limited thereto. In some embodiments, the first reflective zone 180-1 has a frame configuration and is defined to be near the second reflective slope 144b. In some embodiments, the second reflective zone 180-2 is arranged concentric to and encircles the first reflective zone 180-1, and is near the UV radiation source 120. The nth reflective zone 180-n (though not shown) is arranged concentric to and encircles the n–1th reflective zone 180-n–1, and is nearer to the UV radiation source 120 than the n–1th reflective zone 180-n–1. It should be easily realized that a plurality of reflective zones 180-1 to 180-n can be defined according to process requirements. In other embodiments, an alternative arrangement can be provided, wherein the first reflective zone 180-1 is near the UV radiation source 120, the second reflective zone 180-2 is near the second reflective slope 144b, and the nth reflective zone 180-n is near the second reflective slope 144b.

In some embodiments, the plurality of reflective zones respectively have a rough surface, and an Ra value of those rough surfaces is between approximately 0.5 µm and approximately 100 µm, but the disclosure is not limited thereto. Significantly, the Ra value of the rough surface of the second reflective zone 180-2 is less than the Ra value of the rough surface of the first reflective zone 180-1, and the Ra value of the rough surface of the nth reflective zone 180-n is less than the Ra value of the rough surface of the n–1th reflective zone 180-n–1. In some embodiments, the Ra value of the surface of the nth reflective zone 180-n is less than 0.5 µm, but the disclosure is not limited thereto. Therefore, the surface of the nth reflective zone 180-n is a smooth surface when compared to the rough surfaces of the first, second and n–1th reflective zones 180-1, 180-2 and 180-n–1. In other words, the first reflective slope 144a of the secondary reflector 142 is divided into reflective zones having the rough surfaces with outwardly-reducing Ra values, according to the process requirements.

In some embodiments, the apparatus for wafer processing 100 can include the secondary reflector 142 as shown in FIG. 10 or 11, and the primary reflector 140 as shown in FIG. 5, 7 or 8, and can further include the transparent window 130 as shown in FIG. 3A, 3B or 4.

Figure 12:
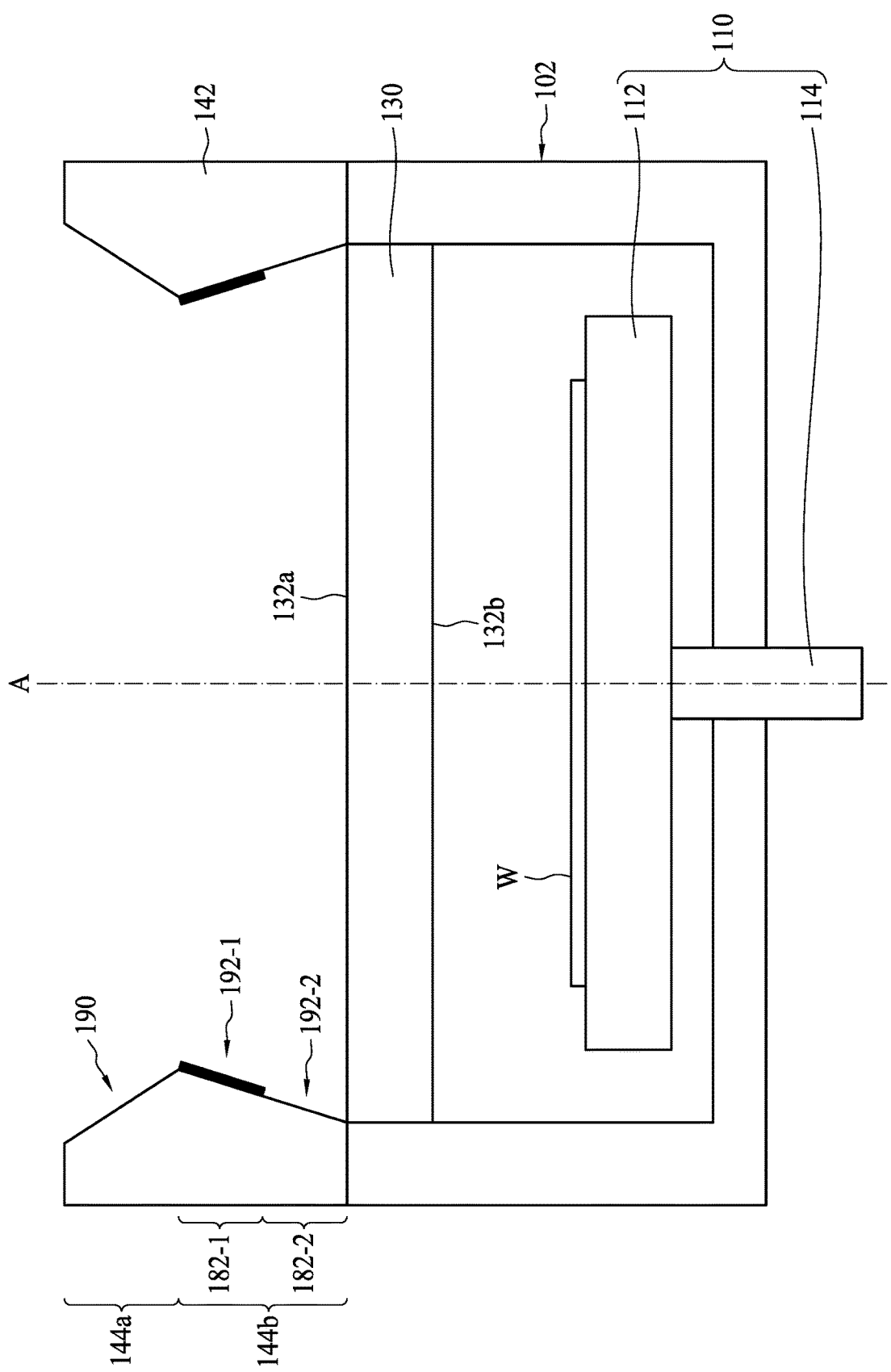
FIG. 12 is a cross-sectional view of a secondary reflector of the apparatus for wafer processing according to aspects of the present disclosure in one or more embodiments.
Figure 13:
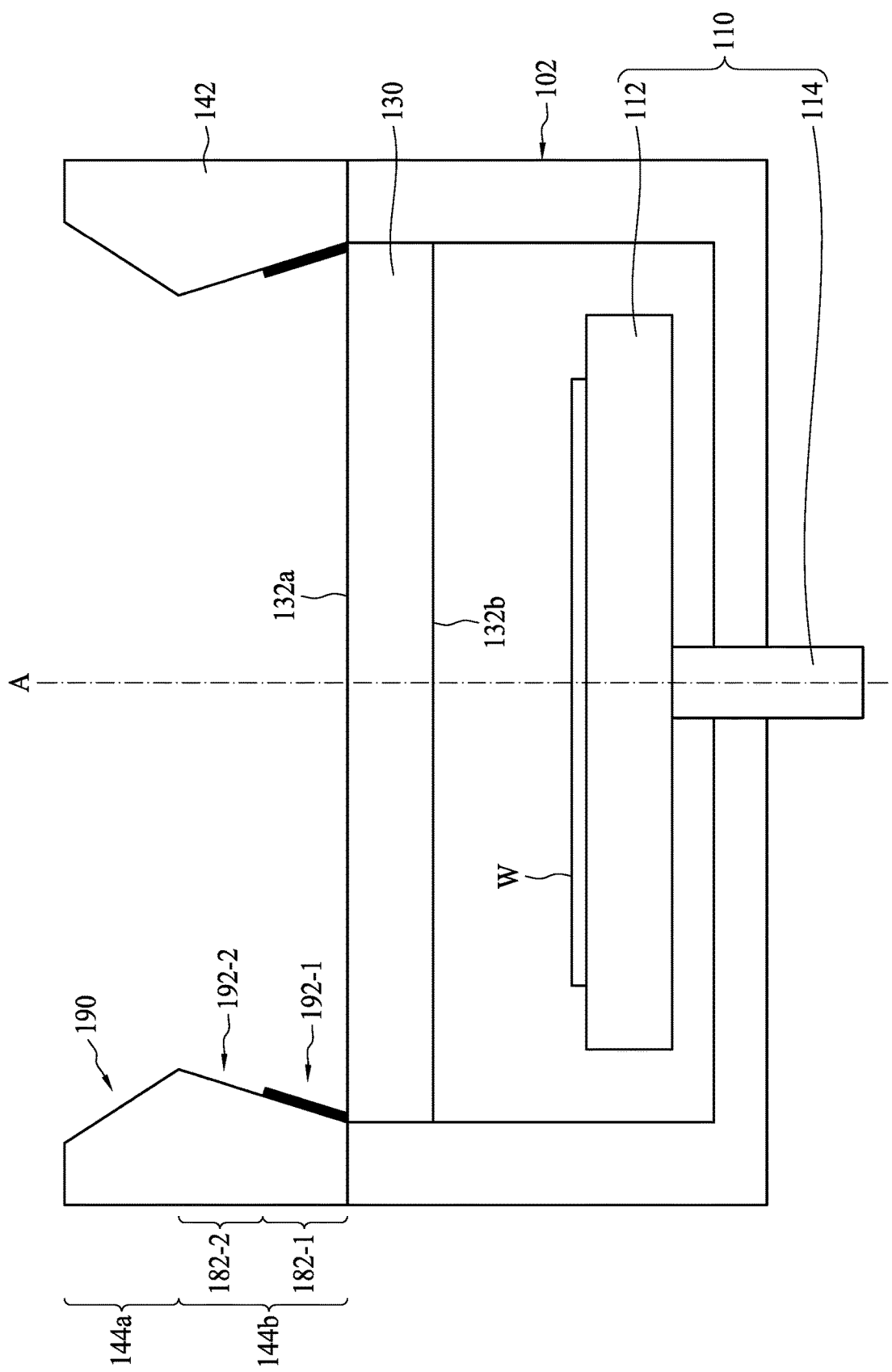
FIG. 13 is a cross-sectional view of a secondary reflector of the apparatus for wafer processing according to aspects of the present disclosure in one or more embodiments.
Figure 14:
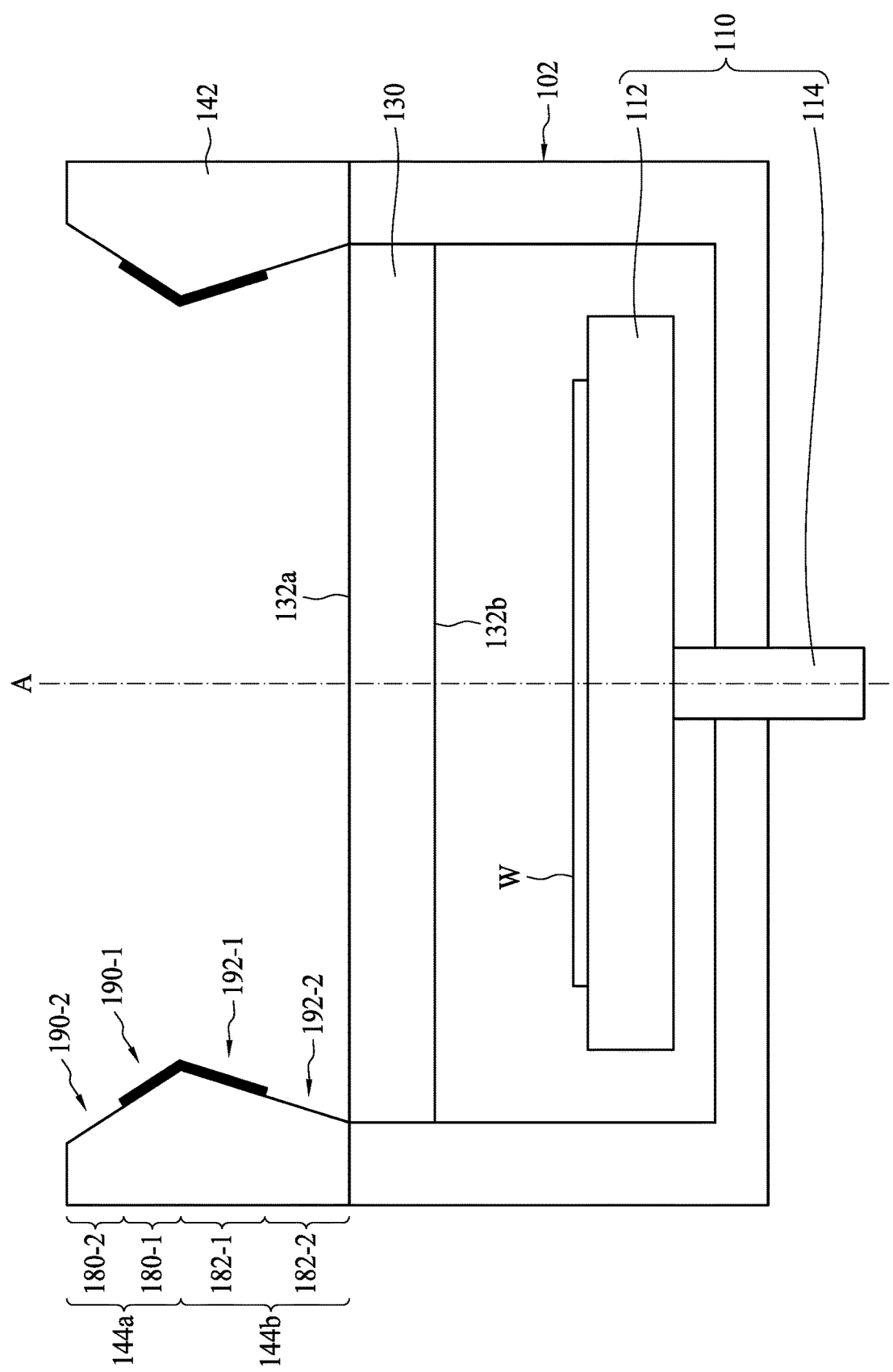
FIG. 14 is a cross-sectional view of a secondary reflector of the apparatus for wafer processing according to aspects of the present disclosure in one or more embodiments.

Please refer to FIGS. 12 to 14, which are schematic drawings illustrating a secondary reflector of the apparatus for wafer processing according to aspects of the present disclosure in different embodiments. In some embodiments, a first reflective zone 182-1 and a second reflective zone 82-2 are defined over the second reflective slope 144b, as shown in FIGS. 12 and 13. The configuration of the first and second reflective zones 182-1 and 182-2 can be similar to that of the first and second reflective zones 192-1 and 182-2, and therefore such details are omitted in the interest of brevity. In some embodiments, the first reflective zone 182-1 is defined to be near the first reflective slope 144a, while the second reflective zone 182-2 is defined to be near the transparent window 130, as shown in FIG. 12. However, in other embodiments, the first reflective zone 182-1 is defined to be near the transparent window 130, while the second reflective zone 182-2 is near the first reflective slope 144a, as shown in FIG. 13. In still other embodiments, the first reflective zones 180-1 and 182-1 are defined over both of the first and second reflective slopes 144a and 144b, and the second reflective zones 180-2 and 182-2 are defined over both of the first and second reflective slopes 144a and 144b. In some embodiments, the first reflective zones 180-1 and 182-1 can be coupled to each other, while the second reflective zones 180-2 and 182-2 are separated from each other by the coupled first reflective zones 180-1 and 182-1, as shown in FIG. 14, but the disclosure is not limited thereto.

Referring to FIGS. 12 to 14, in some embodiments, the first reflective zone 182-1 has a rough surface 192-1, and the second reflective zone 182-2 has a surface 192-2. It should be noted that an Ra value of the rough surface 192-1 can be similar to the Ra value of the rough surface 190-1, and therefore such details are omitted for brevity. An Ra value of the surface 192-2 of the second reflective zone 182-2 can be similar to the Ra value of the surface 190-2, and therefore such details are omitted for brevity. As mentioned above, the surfaces 190-2 and 192-2 of the second reflective zone 180-2 and 182-2 are smooth surfaces when compared to the rough surfaces 190-1 and 192-1 of the first reflective zones 180-1 and 182-1. In other words, the first reflective slope 144a and/or the second reflective slope 144b can be divided into the first reflective zone 180-1, 182-1 having the rough surfaces 190-1, 192-1, and the second reflective zone 180-2, 182-2 having the smooth surfaces 190-2, 192-2, as shown in FIGS. 12 to 14.

The rough surfaces 192-1 of the first reflective zone 182-1 can be formed by the method mentioned above, and therefore such details are omitted for brevity.

As mentioned above, in the first reflective zones 180-1 and/or 182-1, the UV radiation does not follow the law of reflection because of the rough surface, and therefore an incidence angle of the UV radiation is not equal to the reflection angle in the first reflection zones 180-1 and/or 182-1. In other words, UV radiation in the first reflective zones 180-1 and/or 182-1 is scattered by the rough surfaces 190-1 and/or 192-1.

As also mentioned above, a plurality of reflective zones can be defined over the secondary reflector 142, and therefore such details are omitted in the interest of brevity. Similarly, the apparatus for wafer processing 100 can include the secondary reflector 142 as shown in FIG. 10, 11, 12, 13 or 14, the primary reflector 140 as shown in FIG. 5, 7 or 8, and the transparent window 130 as shown in FIG. 3A, 3B or 4.

According to the apparatus for wafer processing provided by the present disclosure, a uniform UV radiation on the wafer can be obtained. In some embodiments, a rough surface is provided over a UV transparent window. In some embodiments, a rough surface is provided over a primary reflector. In some embodiments, a rough surface is provided over a secondary reflector. In some embodiments, the apparatus can include the combination of the above-mentioned rough surfaces over the UV transparent window, the primary reflector and the secondary reflector. Further, the apparatus can include different rough surface arrangements over the UV transparent window, the primary reflector and the secondary reflector. The rough surfaces over the diffusive zone(s) and reflective zones help to redirect and scatter UV radiation, and thus a uniformity of the UV radiation is improved.

During a wafer process, such as a UV curing operation for a dielectric layer, the UV radiation is redirected and scattered when the UV radiation passes through the transparent window and/or is reflected by the primary and secondary reflectors. Accordingly, the k-value of a dielectric layer over the processed wafer has a more uniform distribution, and the localized shrinkage issue over the processed wafer is mitigated. As such, the electrical properties of the semiconductor device can be improved.

In some embodiments, an apparatus for wafer processing is provided. The apparatus includes a wafer pedestal configured to support a wafer, a radiation source configured to provide an electromagnetic radiation to the wafer, and a transparent window disposed between the wafer pedestal and the radiation source. In some embodiments, the transparent window has a first zone having a first rough surface, and an Ra value of the first rough surface is between approximately 0.5 μm and approximately 100 μm.

In some embodiments, an apparatus for wafer processing is provided. The apparatus includes a wafer pedestal configured to support a wafer, a radiation source configured to provide an electromagnetic radiation to the wafer, a transparent window disposed between the wafer pedestal and the radiation source, and a primary reflector disposed in the radiation source and configured to reflect the radiation toward the transparent window. In some embodiments, the primary reflector has a first reflective zone having a first rough surface, and an Ra value of the first rough surface is between approximately 0.5 μm and approximately 100 μm.

In some embodiments, an apparatus for wafer processing is provided. The apparatus includes a wafer pedestal configured to support a wafer, a radiation source configured to provide an electromagnetic radiation to the wafer, a transparent window disposed between the wafer pedestal and the radiation source, a primary reflector disposed in the radiation source and configured to reflect the radiation toward the transparent window, and a secondary reflector disposed between the transparent window and the radiation source. In some embodiments, the secondary reflector has a first reflective zone having a first rough surface, and an Ra value of the first rough surface is between approximately 0.5 μm and approximately 100 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for wafer processing comprising:
   A wafer pedestal configured to support a wafer;
   a UV radiation source configured to provide an electromagnetic radiation to the wafer; and
   a transparent window disposed between the wafer pedestal and the UV radiation source,
   wherein the transparent window has a first zone having a first rough surface, and a second zone encircling the first zone, an arithmetical mean roughness (Ra) value of the first rough surface is between approximately 0.5 micrometer and approximately 100 um, wherein the first zone faces the UV radiation source, and a reflectivity in the second zone is greater than a reflectivity in the first zone, and wherein a reflectivity in the first zone is less than approximately 0.1%, and the reflectivity in the second zone is approximately 3%.

2. The apparatus of claim 1, wherein a diameter of the first zone is less than a diameter of the transparent window.

3. The apparatus of claim 1, wherein the second zone has a second rough surface, and an Ra value of the second rough surface is less than the Ra value of the first rough surface.

4. The apparatus of claim 1, wherein the first zone has a circular shape and is defined in a center region of the transparent window, and the second zone is arranged concentric to the first zone.

5. The apparatus of claim 1, further comprising:
a primary reflector disposed in the UV radiation source; and
a secondary reflector disposed between the transparent window and the UV radiation source.

6. An apparatus for wafer processing comprising:
a wafer pedestal configured to support a wafer;
a UV radiation source configured to provide an electromagnetic radiation to the wafer; and
a transparent window disposed between the wafer pedestal and the UV radiation source, wherein the transparent window has a first surface facing the radiation source and a second surface facing the wafer pedestal,
wherein the first surface of the transparent window has a first zone and a second zone, an Ra value of the first zone of the first surface is greater than an Ra value of the second zone of the first surface and a reflectivity in the second zone is greater than a reflectivity in the first zone, and wherein a reflectivity in the first zone is less than approximately 0.1%, and the reflectivity in the second zone is approximately 3%.

7. The apparatus of claim 6, wherein the Ra value of the first zone of the first surface is between approximately 0.5 micrometer and approximately 100 μm, and the Ra value of the second zone of the first surface is less than 0.5 μm.

8. The apparatus of claim 6, wherein a diameter of the first zone of the first surface is less than a diameter of the transparent window.

9. The apparatus of claim 6, wherein the first zone of the first surface has a circular shape and is defined in a center region of the transparent window, and the second zone of the first surface is arranged concentric to and encircles the first zone of the first surface.

10. The apparatus of claim 6, wherein the second surface of the transparent window has a third zone and a fourth zone, and an Ra value of the third zone of the second surface is greater than an Ra value of the fourth zone of the second surface.

11. The apparatus of claim 10, wherein the Ra value of the third zone of the second surface is between approximately 0.5 micrometer and approximately 100 μm, and the Ra value of the fourth zone of the second surface is less than 0.5 μm.

12. The apparatus of claim 10, wherein a diameter of the third zone of the second surface is less than a diameter of the transparent window.

13. The apparatus of claim 10, wherein the third zone of the second surface has a circular shape and is defined in a center region of the transparent window, and the fourth zone of the second surface is arranged concentric to and encircles the third zone of the second surface.

14. The apparatus of claim 10, wherein the first zone of the first surface substantially overlaps the third zone of the second surface.

15. An apparatus for wafer processing comprising:
a wafer pedestal configured to support a wafer;
a UV radiation source configured to provide an electromagnetic radiation to the wafer; and
a transparent window disposed between the wafer pedestal and the UV radiation source,
wherein the transparent window has a surface facing the radiation source, the surface has a first zone, a second zone and a third zone, the first zone is defined in a center region of the transparent window, the third zone is concentric to and encircles the first zone, the second zone is between the first zone and the third zone, an Ra value of the second zone is less than an Ra value of the first zone, and an Ra value of the third zone is less than an Ra value of the second zone, and a reflectivity in the second zone is greater than a reflectivity in the first zone, and wherein a reflectivity in the first zone is less than approximately 0.1%, and the reflectivity in the second zone is approximately 3%.

16. The apparatus of claim 15, wherein a diameter of the first zone is less than a diameter of the transparent window.

17. The apparatus of claim 15, further comprising:
a primary reflector disposed in the UV radiation source; and
a secondary reflector disposed between the transparent window and the UV radiation source.

* * * * *